US012621939B2

(12) United States Patent
Jang

(10) Patent No.: US 12,621,939 B2
(45) Date of Patent: May 5, 2026

(54) FLEXIBLE DISPLAY DEVICE AND METAL PLATE THEREFOR

(71) Applicant: Samsung Display Co., LTD., Yongin-si (KR)

(72) Inventor: Min Sok Jang, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 240 days.

(21) Appl. No.: 18/124,652

(22) Filed: Mar. 22, 2023

(65) Prior Publication Data

US 2024/0032212 A1     Jan. 25, 2024

(30) Foreign Application Priority Data

Jul. 22, 2022     (KR) ........................ 10-2022-0091093

(51) Int. Cl.
    *G06F 1/16*        (2006.01)
    *B32B 3/26*        (2006.01)
    (Continued)

(52) U.S. Cl.
    CPC ................. *H05K 5/02* (2013.01); *B32B 3/26* (2013.01); *B32B 3/266* (2013.01); *B32B 15/02* (2013.01); *H05K 5/06* (2013.01); *H10K 77/111* (2023.02); *B32B 15/08* (2013.01); *B32B 15/095* (2013.01); *B32B 15/20* (2013.01); *B32B 27/281* (2013.01); *B32B 27/40* (2013.01); *B32B 2255/06* (2013.01);
    (Continued)

(58) Field of Classification Search
    CPC ... H05K 5/02; H05K 5/06; B32B 3/26; B32B 3/266; B32B 15/02; B32B 15/08; B32B 15/095; B32B 15/20; B32B 27/281; B32B 27/40; B32B 2255/06; B32B 2255/28; B32B 2307/558; B32B 2457/20; H10K 77/111; H10K 2102/311; G06F 1/1652; G09F 9/301; G09F 9/335; H04M 1/0268
See application file for complete search history.

(56) References Cited

U.S. PATENT DOCUMENTS 7,773,190 B2     8/2010   Kwak et al.
9,645,449 B2     5/2017   Park et al.
                 (Continued)

FOREIGN PATENT DOCUMENTS

CN          108376698          8/2018
CN          113314032          8/2021
                 (Continued)

OTHER PUBLICATIONS

English Translation for JP2020118790. (Year: 2020).*
Indian Office Action for Indian Application No. 202517004339; Report Mail Date Mar. 27, 2026 (7 Pages).

*Primary Examiner* — Imani N Hayman
*Assistant Examiner* — Hung Q Dang
(74) *Attorney, Agent, or Firm* — CANTOR COLBURN LLP

(57)     ABSTRACT

A flexible display device includes: a display panel including pixels, where a folding area is defined in the display panel; and a metal plate disposed on a rear surface of the display panel, where the metal plate includes: a lower metal plate; an upper metal plate including a step portion; and a main spacer and a subspacer disposed between the lower metal plate and the upper metal plate, where the subspacer overlaps the step portion in a plan view.

16 Claims, 15 Drawing Sheets

(51) Int. Cl.

| | |
|---|---|
| *B32B 15/02* | (2006.01) |
| *H05K 5/02* | (2006.01) |
| *H05K 5/06* | (2006.01) |
| *H10K 77/10* | (2023.01) |
| *B32B 15/08* | (2006.01) |
| *B32B 15/095* | (2006.01) |
| *B32B 15/20* | (2006.01) |
| *B32B 27/28* | (2006.01) |
| *B32B 27/40* | (2006.01) |
| *H10K 102/00* | (2023.01) |

(52) U.S. Cl.

CPC ..... *B32B 2255/28* (2013.01); *B32B 2307/558* (2013.01); *B32B 2457/20* (2013.01); *H10K 2102/311* (2023.02)

(56) References Cited

U.S. PATENT DOCUMENTS

| | | | |
|---|---|---|---|
| 11,348,488 B2 | 5/2022 | Jang | |
| 2017/0090233 A1 | 3/2017 | Xu et al. | |
| 2021/0319724 A1* | 10/2021 | Jang ..................... | G06F 1/1641 |
| 2021/0337686 A1 | 10/2021 | Sim et al. | |

FOREIGN PATENT DOCUMENTS

| | | |
|---|---|---|
| CN | 216310486 | 4/2022 |
| JP | 2020118790 A | 8/2020 |
| KR | 1020070038852 | 4/2007 |
| KR | 101157978 B1 | 6/2012 |
| KR | 1020140147299 | 12/2014 |
| KR | 102239278 | 4/2021 |
| KR | 1020210126175 | 10/2021 |
| KR | 20210130873 A | 11/2021 |

* cited by examiner (A)

(B)

(C)

(A)                    (B)

FLEXIBLE DISPLAY DEVICE AND METAL PLATE THEREFOR

This application claims priority to Korean Patent Application No. 10-2022-0091093, filed on Jul. 22, 2022, the content of which in its entirety is herein incorporated by reference.

BACKGROUND

1. Field

The disclosure relates to a flexible display device and a metal plate for a flexible display device, and more specifically, to a flexible display device with enhanced impact resistance without causing a problem due to folding, and a metal plate for the flexible display device.

2. Description of the Related Art

A display device, such as an organic light emitting diode display, includes a display panel, and the display panel is manufactured to include several layers and elements on a substrate. Conventionally, glass has been used as a substrate of a display panel. However, since the glass substrate is rigid, it is difficult to bend or deform the display device. Recently, a flexible display device using a flexible substrate including or made of a material which is light and easy to deform, e.g., plastic, has been developed.

The flexible display device may be classified into a bendable display device, a foldable display device, a rollable display device, and the like depending on its usage and form. Such a flexible display device may be bent or folded using a flexible substrate made of, e.g., plastic.

In addition, a display device may include a function of detecting a touch position when a screen is touched, and depending on the display device, a touch of a hand or a touch of a separately provided pen may be detected.

SUMMARY

Embodiments provide a flexible display device and a metal plate for the flexible display device which is foldable several times without defects while having enhanced impact resistance.

An embodiment provides a flexible display device including: a display panel including pixels, where a folding area is defined in the display panel; and a metal plate disposed on a rear surface of the display panel, where the metal plate includes: a lower metal plate; an upper metal plate including a step portion; and a main spacer and a subspacer, which are disposed between the lower metal plate and the upper metal plate, where the subspacer overlaps the step portion in a plan view.

In an embodiment, the upper metal plate may include a first portion and a second portion having a greater thickness than a thickness of the first portion, and the main spacer may overlap the second portion in the plan view.

In an embodiment, air may be between the lower metal plate and the upper metal plate and around the main spacer and the subspacer.

In an embodiment, the metal plate may further include a sealant disposed along a periphery thereof, and the sealant may seal a space between the upper metal plate and the lower metal plate.

In an embodiment, the sealant may further include a plurality of conductive spacers, and the conductive spacers may be in contact with the upper metal plate and the lower metal plate.

In an embodiment, a filler may be disposed in a space sealed by the sealant, where the filler functions as a buffer.

In an embodiment, the metal plate may have a folding area in a portion corresponding to the folding area of the display panel, and a mesh pattern portion with a plurality of openings may be defined in the folding area of the metal plate.

In an embodiment, the main spacer and the subspacer may be positioned not to overlap the openings of the mesh pattern portion in the plan view.

In an embodiment, the main spacer, the subspacer, and the step portion may be positioned over an entire area of the metal plate.

In an embodiment, the metal plate may have a folding area in a portion corresponding to the folding area of the display panel, and the main spacer, the subspacer, and the step portion may be positioned in the folding area of the metal plate.

In an embodiment, the upper metal plate may include a metal plate having a plate-like structure and a plurality of insulating layers disposed on the metal plate, and the step portion may be positioned between adjacent insulating layers among the insulating layers on the metal plate in the plan view.

In an embodiment, the flexible display device may further include a cover window disposed on a front surface of the display panel, and a protective layer or a cushion layer disposed between the display panel and the metal plate.

An embodiment provides a metal plate including: a lower metal plate; an upper metal plate including a step portion; and a main spacer and a subspacer disposed on the lower metal plate, where the subspacer overlaps the step portion in a plan view, the upper metal plate includes a first portion corresponding to the step portion and a second portion having a greater thickness than a thickness of the first portion, and the main spacer overlaps the second portion in the plan view.

In an embodiment, air may be between the lower metal plate and the upper metal plate and around the main spacer and the subspacer.

In an embodiment, the metal plate may further include a sealant disposed along a periphery thereof, and the sealant may seal a space between the upper metal plate and the lower metal plate.

In an embodiment, the sealant may further include a plurality of conductive spacers, and the conductive spacers may be in contact with the upper metal plate and the lower metal plate.

In an embodiment, a filler may be disposed in a space sealed by the sealant, where the filler functions as a buffer.

In an embodiment, a mesh pattern portion with a plurality of openings may be defined in a folding area of the metal plate.

In an embodiment, the main spacer and the subspacer may be positioned not to overlap the openings of the mesh pattern portion in the plan view.

In an embodiment, the upper metal plate may include a metal plate having a plate-like structure and a plurality of insulating layers disposed on the metal plate, and the step portion may be positioned between adjacent insulating layers among the insulating layers on the metal plate in the plan view.

According to embodiments, a plurality of spacers may be formed in the metal plate, and some spacers among the spacers may not contact the upper metal plate to have a buffering effect against an impact, thereby enhancing impact resistance. In such embodiments, since a metal plate complements impact resistance, in a flexible display device, a deformation rate may be increased by adopting a material or a physical property without considering impact resistance, except for the metal plate, and as a result, bending deformation that may occur in a folding area of the flexible display device may be effectively prevented or substantially reduced.

DETAILED DESCRIPTION

Figure 1:
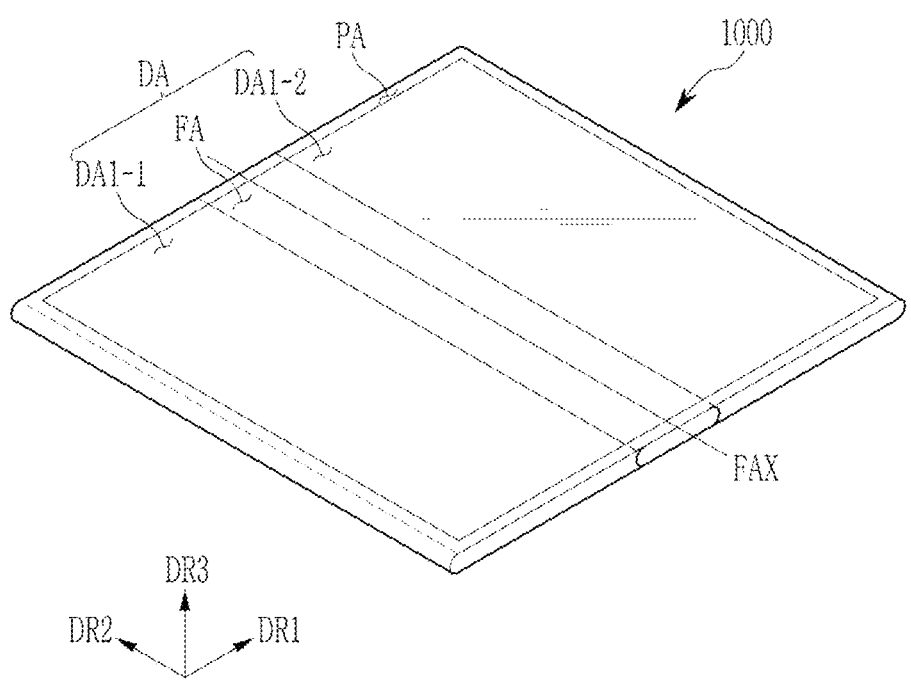
FIG. 1 illustrates a schematic perspective view of a flexible display device according to an embodiment.

The invention will be described more fully hereinafter with reference to the accompanying drawings, in which various embodiments of the invention are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

Further, since sizes and thicknesses of constituent members shown in the accompanying drawings are arbitrarily given for better understanding and ease of description, the invention is not limited to the illustrated sizes and thicknesses. In the drawings, the thicknesses of layers, films, panels, regions, etc., are exaggerated for clarity. In the drawings, for better understanding and ease of description, the thicknesses of some layers and areas are exaggerated.

It will be understood that when an element such as a layer, film, region, plate, constitute elements, etc. is referred to as being "on" another element, it can be directly on the other element or intervening elements may also be present. In contrast, when an element is referred to as being "directly on" another element, there are no intervening elements present. Further, in the specification, the word "on" or "above" means positioned on or below the object portion, and does not necessarily mean positioned on the upper side of the object portion based on a gravitational direction.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The terms "below" or "beneath" can, therefore, encompass both an orientation of above and below.

Further, throughout the specification, the phrase "in a plan view" means when an object portion is viewed from above, and the phrase "in a cross-sectional view" means when a cross-section taken by vertically cutting an object portion is viewed from the side.

In addition, in the specification, "connected" means that two or more components are not only directly connected, but two or more components may be connected indirectly through other components, physically connected as well as being electrically connected, or it may be referred to by different names depending on the location or function, but may include connecting each of parts that are substantially integral to each other.

In addition, throughout the specification, when it is said that a portion of a wire, layer, film, region, plate, component, etc., "extends in a first direction or a second direction," this does not indicate only a straight shape extending straight in the corresponding direction, and indicates a structure that generally extends along the first direction or the second direction, and it includes a structure that is bent at a portion, has a zigzag structure, or extends while including a curved structure.

In addition, an electronic device (e.g., a mobile phone, TV, monitor, notebook computer, etc.) including a display device, a display panel, etc. described in the specification, or an electronic device including a display device and a display panel manufactured by the manufacturing method described in the specification, are not excluded from the scope of the specification.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the disclosure, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the claims.

Hereinafter, a flexible display device according to an embodiment will be described with reference to FIG. 1.

FIG. 1 illustrates a schematic perspective view of a flexible display device according to an embodiment.

The flexible display device 1000 according to an embodiment, which is a device for displaying a moving image or a still image, may be used as a display screen of various products, such as a television, a laptop computer, a monitor, a billboard, the Internet of things (IOT), etc., as well as portable electronic devices such as a mobile phone, a smart phone, a tablet personal computer, a mobile communication terminal, an electronic notebook, an e-book, a portable multimedia player (PMP), a navigation system, and an ultra mobile PC (UMPC). In addition, the flexible display device 1000 according to an embodiment may be used in a wearable device such as a smart watch, a watch phone, a glasses display, or a head mounted display (HMD). In addition, the flexible display device 1000 according to an embodiment may be used as an instrument panel of a vehicle, a center information display (CID) provided at a center fascia or dashboard of a vehicle, a room mirror display that replaces a side mirror of a vehicle, or a display provided on a back surface of a front seat of a vehicle.

Referring to FIG. 1, an embodiment of the flexible display device 1000 may display an image in a third direction DR3 on a display surface parallel to each of a first direction DR1 and a second direction DR2. A display surface on which an image is displayed may correspond to a front surface of the flexible display device 1000, and the image may include a still image as well as a dynamic image.

In an embodiment, a front surface (or upper surface) and a rear surface (or lower surface) of each member are defined based on a direction in which the image is displayed. The front and rear surfaces may be opposite to each other in the third direction DR3, and a normal direction of each of the front and rear surfaces may be parallel to the third direction DR3. A distance between the front surface and the rear surface in the third direction DR3 may correspond to a thickness of a display panel DP in the third direction DR3. That is, the third direction DR3 may be a thickness direction of the flexible display device 1000.

The flexible display device 1000 according to an embodiment may sense a user input applied from the outside. The user input may include various types of external inputs, such as a part of a user's body, light, heat, or pressure. In an embodiment, a user input may be an input by a user's hand applied to the front or an input by a pen such as a stylus pen used by a user, but the invention is not limited thereto. In addition, the flexible display device 1000 may sense the user input applied to a side surface or the rear surface of the flexible display device 1000 depending on a structure of the flexible display device 1000.

In an embodiment, the flexible display device 1000 may include a display area DA and a peripheral area PA (hereinafter also referred to as a non-display area). The display area DA is an area in which an image is displayed, and may be an area in which an external input is sensed at the same time. The display area DA may be an area in which a plurality of pixels to be described later are positioned.

Figure 2:
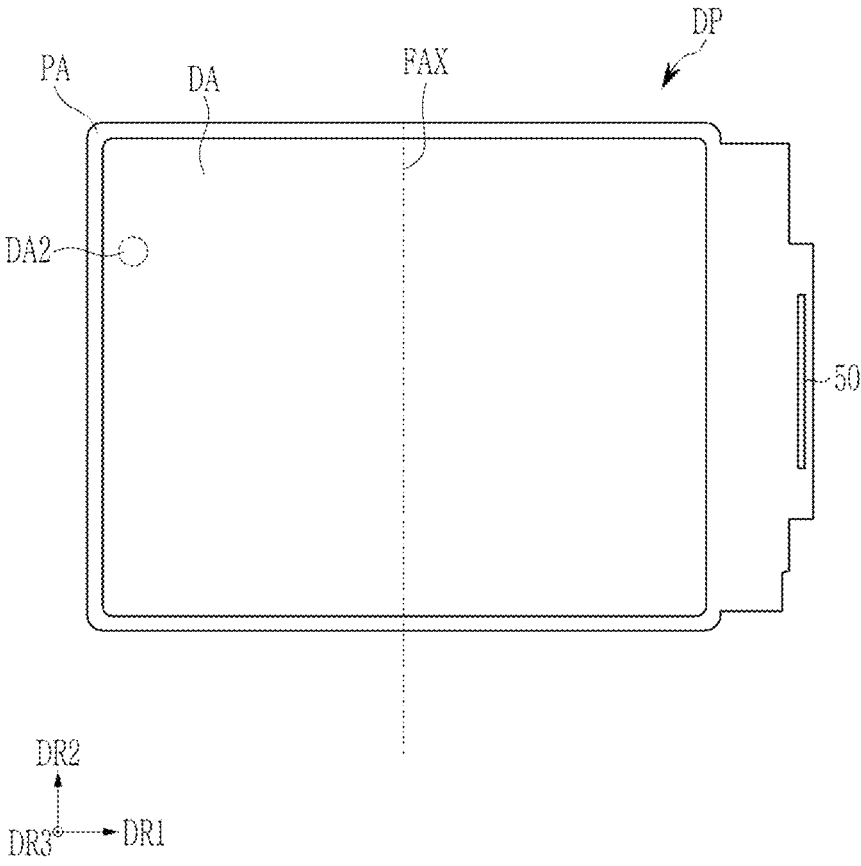
FIG. 2 illustrates a plan view showing a flexible display panel according to an alternative embodiment.

The display area DA may include a first display area DA1 and a second display area DA2 (see FIG. 2).

In an embodiment, a plurality of light emitting diodes and a plurality of pixel circuit units that generate and transfer emission currents to the respective light emitting diodes are disposed or formed in the display area DA1. In such an embodiment, one light emitting diode and one pixel circuit unit connected thereto are collectively referred to as a pixel PX. In the first display area DA1, one pixel circuit unit and one light emitting diode are formed on a one-to-one basis.

In an embodiment, the first display DA1 may be divided into a first first display area DA1-1, a second first display area DA1-2, and a folding area FA. The first first display area DA1-1 and the second first display area DA1-2 may be positioned at left and right sides, respectively, with respect to (or at a center) of the folding axis FAX, and the folding area FA may be positioned between the first first display area DA1-1 and the second first display area DA1-2. In such an embodiment, when folded outward based on the folding axis FAX, the first first display area DA1-1 and the second first display area DA1-2 may be positioned at opposite sides in the third direction DR3, and images may be displayed in both directions. In addition, when folded inward based on the folding axis FAX, the first first display area DA1-1 and the second first display area DA1-2 may not be viewed from the outside.

According to an alternative embodiment, the display area DA may further include a second display area (refer to DA2 in FIG. 2), and such an embodiment will be described with reference to FIG. 2.

In FIG. 2, a planar structure of the display panel DP that may be included in the flexible display device 1000 according to an alternative embodiment will be described.

FIG. 2 illustrates a plan view showing a flexible display panel according to an alternative embodiment.

In an embodiment, the display panel DP included in the flexible display device 1000 has a display area DA positioned on a front side, and the display area DA is largely divided into a first display area DA1 (hereinafter also referred to as a main display area) and a second display area DA2 (hereinafter also referred to as a component area).

In an embodiment, a plurality of light emitting diodes and a plurality of pixel circuit units that generate and transfer emission currents to the respective light emitting diodes are disposed or formed in the display area DA1. Herein, one light emitting diode and one pixel circuit unit connected thereto are collectively referred to as a pixel PX. In the first display area DA1, one pixel circuit unit and one light emitting diode are formed on a one-to-one basis.

The second display area DA2 may include a light transmitting area, and may additionally include a pixel for displaying an image. The second display area DA2 may be an area that at least partially overlaps an optical element such as a camera or an optical sensor. Although FIG. 2 illustrates an embodiment where the second display area DA2 is provided to have a circular shape at a left side of the flexible display device 1000, the invention is not limited thereto. Alternatively, the second display area DA2 may be provided in various numbers and shapes depending on a number and shape of optical elements.

The flexible display device 1000 may receive an external signal used for an optical device through the second display area DA2, or may provide a signal output from the optical device to the outside. In an embodiment, since the second display area DA2 overlaps the light transmitting area, an area of the peripheral area PA for forming the light transmitting area may be reduced.

According to an embodiment, a boundary area may be positioned between the first display area DA1 and the second display area DA2.

The peripheral area PA may be further positioned outside the display area DA. In an embodiment shown in FIG. 2, the second display area DA2 is surrounded by the first display area DA1 so that an area of the display area DA is not reduced due to the second display area DA2, and the area of the peripheral area PA may not increase.

Referring to FIG. 1 and FIG. 2, in an embodiment, the flexible display device 1000 may be a foldable flexible display device. The flexible display device 1000 may be folded outwardly or inwardly based on the folding axis FAX. When folded outward based on the folding axis FAX, display surfaces of the flexible display device 1000 are respectively positioned outside in the third direction DR3 to display images in opposite directions. When folded inward based on the folding axis FAX, the display surfaces may not be visually recognized from the outside.

In an embodiment, as shown in FIG. 2, the peripheral area PA is disposed outside the display area DA, and a driver 50 is also provided in the peripheral area PA. The peripheral area PA may be divided into the driver 50, a connection line, and a bending area because the display area DA is positioned outside. According to an embodiment, a portion of the display panel DP where the driver is positioned may be folded in a way such that the driver 50 is positioned behind the display area DA during a manufacturing process of the flexible display device 1000 including the display panel DP.

In an embodiment, as shown in FIG. 2, the driver 50 may be positioned in the peripheral area PA in the first direction DR1 of the display area DA, and the driver 50 extends in a direction that is parallel to the folding axis FAX, but a position of the driver 50 may be variously changed.

Hereinafter, an overall cross-sectional structure of the flexible display device 1000 according to an embodiment will be described with reference to FIG. 3.

Figure 3:
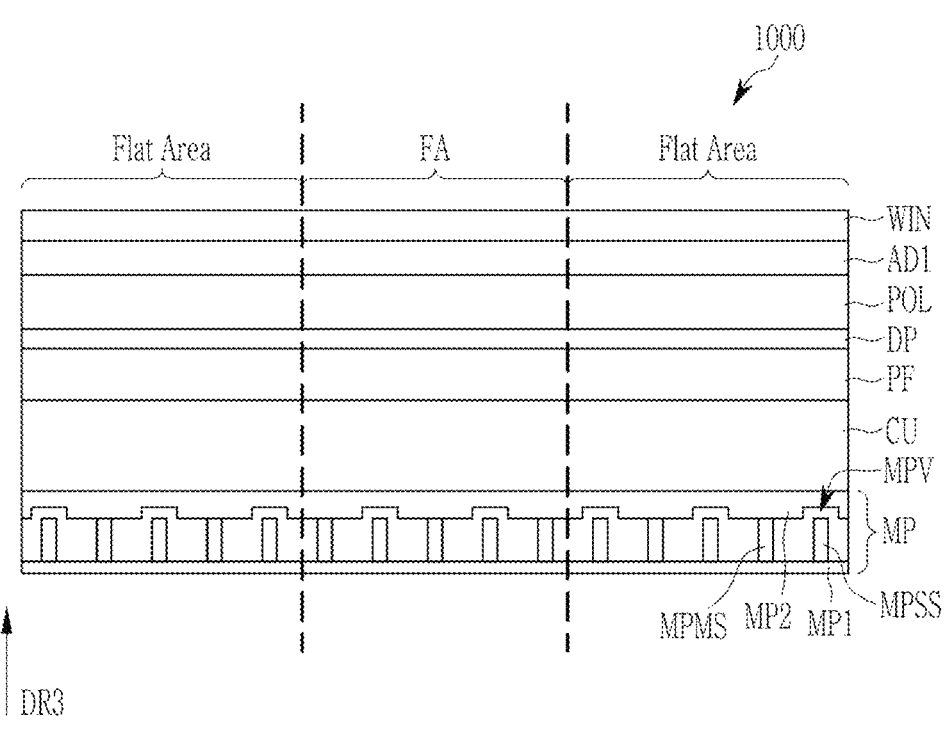
FIG. 3 illustrates a cross-sectional view showing a flexible display device according to an embodiment.

FIG. 3 illustrates a cross-sectional view showing a flexible display device according to an embodiment.

In the flexible display device 1000 according to an embodiment, a protective layer PF, a cushion layer CU, and a metal plate MP are positioned on a rear surface of the display panel DP, and a polarizer POL and a cover window WIN are positioned on a front surface thereof with respect to the display panel DP.

The display panel DP may include a display unit in which a plurality of pixels are positioned to display an image, a touch sensor TSP positioned above the display unit to sense an external input, and the driver 50 (see FIG. 2). The display panel DP may include a front surface including the display area DA and the peripheral area PA. The display area DA may be an area in which a pixel operates based on an electrical signal to emit light. In an embodiment, a plurality of pixels are positioned at a lower portion of the touch sensor TSP in the display panel DP to display an image in the third direction DR3, and the touch sensor TSP is positioned above the pixels in the third direction DR3 to sense an external input.

The polarizer POL and the cover window WIN are positioned on the front surface of the display panel DP, and the cover window WIN may be attached to the polarizer POL by the first adhesive layer AD1.

The cover window WIN may be divided into a transmissive area and a blocking area, and the transmissive area may at least partially overlap the display area DA of the display panel DP. In an embodiment, for example, the transmissive area may overlap an entire surface of the display area DA, or may overlap at least a portion of the display area DA. Accordingly, a user may view an image through the transmission area, or may provide an external input based on the image. However, the invention is not limited thereto. In alternative an embodiment, for example, an area in which an image is displayed and an area in which the external input is sensed may be separated from each other in the display area DA.

The peripheral area PA of the display panel DP may at least partially overlap the blocking area of the cover window WIN. The peripheral area PA may be an area covered by the blocking area. The peripheral area PA may be adjacent to the display area DA, and may surround the display area DA. An image is not displayed in the peripheral area PA, and a driving circuit, a driving wire, and the like for driving the display area DA may be positioned.

The flexible display device 1000 according to an embodiment may be a product or an electronic device having a large area screen of 10 inches or more as a foldable display device. In such an embodiment, when the cover window WIN include or is formed of glass, problems such as breakage when the glass is folded may occur. Accordingly, in an embodiment, the cover window WIN may be formed with a polymer film.

In an embodiment, the display panel DP may be assembled in a flat state in which the display area DA and the peripheral area PA face the cover window WIN. However, the invention is not limited thereto.

The polarizer POL may be positioned between the cover window WIN and the display panel DP, and the polarizer POL prevents display quality from being deteriorated or an internal structure of the display panel DP from being viewed while external light is reflected and provided to user eyes after being incident on the display panel DP. According to an embodiment, the polarizer POL may be omitted.

The cover window WIN and the polarizer POL are attached to each other by the first adhesive layer AD1, and the polarizer POL may also be attached to the display panel DP by an adhesive layer (not illustrated).

In an embodiment, the protective layer PF, the cushion layer CU, and the metal plate MP are sequentially positioned on the rear surface of the display panel DP, and each part may be attached by an adhesive layer (not illustrated).

The protective layer PF positioned on the rear surface of the display panel DP is a layer capable of enhancing impact resistance and is also referred to as an impact resistance layer. The protective layer PF may include or be formed of a polyimide (PI) or polyurethane, or a mixed resin including polyimide (PI) or a polyurethane. According to an embodiment, the protective layer PF may include a copolymer including at least one resin including a urethane functional group. Herein, the urethane functional group may include —NH (Peak (3200~3300 cm$^{-1}$) or —C=O (Peak (1700~1750 cm$^{-1}$).

The impact resistance may be increased by increasing a thickness of the protective layer PF. However, as described above, if the thickness of the protective layer PF is increased, a repulsive force increases when the flexible display device 1000 is folded, and thus reliability is deteriorated when the flexible display device 1000 is folded. Accordingly, in an embodiment, the metal plate MP is formed to have a structure capable of mitigating or absorbing an impact to maintain the impact resistance without increasing the thickness of the protective layer PF. A detailed structure of the metal plate MP will be described later.

The cushion layer CU is positioned on a rear surface of the protective layer PF, and the cushion layer CU includes or is formed of an elastic material to serve to relieve an impact applied from the rear surface of the display panel DP. In addition, according to an embodiment, the cushion layer CU may be formed in black to prevent light from a rear surface thereof from being provided to the display panel DP, and may also serve to prevent the light provided from the display panel DP to the rear surface from being reflected and to not be provided to the front surface.

In an embodiment, the metal plate MP is attached to the rear surface of the cushion layer CU, to maintain the flexible display device 1000 in a folded state when the flexible display device 1000 is folded based on the folding axis FAX, and may include a thin metal plate. In addition, the metal plate MP according to an embodiment has a structure capable of additionally mitigating or absorbing an impact.

The metal plate MP includes a lower metal plate MP1, an upper metal plate MP2, and a plurality of spacers MPMS and MPSS. The upper metal plate MP2 is in contact with the main spacer MPMS (also referred to as the first spacer), but may not be in contact with the subspacer MPSS (also referred to as the second spacer), and a step portion (or a groove) MPV is defined or formed in a portion of the upper metal plate MP2 corresponding to the subspacer MPSS. As a result, when folded or an external impact is not applied, the upper metal plate MP2 and the subspacer MPSS do not come into contact with each other, and may maintain a predetermined distance. Hereinafter, a structure in which a space is formed between the subspacer MPSS and the upper metal plate MP2 by the step portion MPV of the upper metal plate MP2 is also referred to as a buffer structure. Herein, the lower metal plate MP1 and the upper metal plate MP2 may have a plate-like structure including or made of a metal, such as titanium or a titanium alloy, aluminum or an aluminum alloy, for example, or various other metals and alloys thereof may be used, for example, stainless metal may be used. In an embodiment, the spacers MPMS and MPSS may include or be formed of a same organic material, and may have elasticity. In an embodiment, air may be positioned in a space between the lower metal plate MP1 and the upper metal plate MP2 and around the spacers MPMS and MPSS. According to an alternative embodiment, a filler that can serve as a buffer may be filled therein.

The metal plate MP is formed to have a thin thickness to improve folding, and FIG. 3 enlargedly shows the metal plate MP to clearly show a structure of the metal plate MP.

In an embodiment, as described above, a structure of the upper metal plate MP2 having the spacers MPMS and MPSS and the step portion MPV is formed not only in the folding area FA but also in the flat area, and is formed over an entire area of the display panel DP. Alternatively, the structure of the upper metal plate MP2 having the spacers MPMS and MPSS and the step portion MPV may be positioned only in a partial area, e.g., the folding area FA, or may not be formed in a partial area of the display area DA.

A stylus pen is typically used for products with a 10-inch or larger screen, in the flexible display device 1000 of 10 inches or more, it is desired to secure not only a folding characteristic but also impact resistance to the stylus pen. In an embodiment of FIG. 3, impact resistance to the stylus pen is reinforced even in the metal plate MP to prevent damage to the display panel DP. In such an embodiment, the impact resistance of the flexible display device 1000 is improved by being relaxed with a buffer structure formed by the step portion MPV and the subspacer MPSS of the upper metal plate MP2 of the metal plate MP. In such an embodiment, the metal plate MP also mitigates an impact provided from a lower portion of the display panel DP, but also mitigates an impact provided from a front surface of the display panel DP, such as using a stylus pen.

Figure 15:
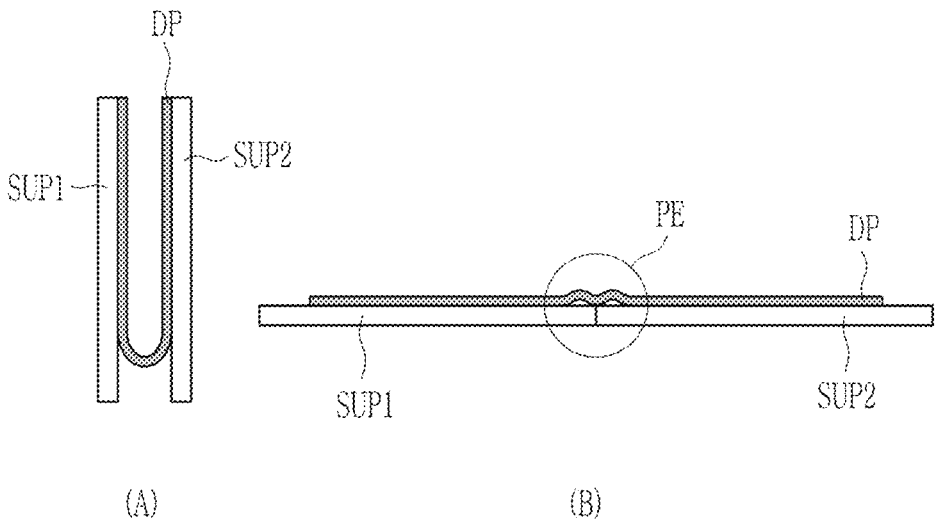

In an embodiment of FIG. 3, since the metal plate MP also mitigates the impact provided from the front surface, an additional film for enhancing impact resistance on the front surface of the display panel DP may be omitted, and a material used for the flexible display device 1000 may also be adopted without considering impact resistance, and thus there are various desired characteristics, e.g., flexural deformation (PE) illustrated in FIG. 15 can be effectively prevented or substantially reduced.

In such an embodiment, when the flexible display device 1000 is folded, a portion of the flexible display device 1000 is stretched or decreased, and in this case, when a modulus value and/or elastic force of a material constituting this portion is increased, the deformation of the corresponding portion is easily generated such that a problem such as flexural deformation (PE) due to folding may be effectively prevented.

Hereinafter, a rear structure of the metal plate MP included in the flexible display device 1000 according to an embodiment will be described with reference to FIG. 4.

Figure 4:
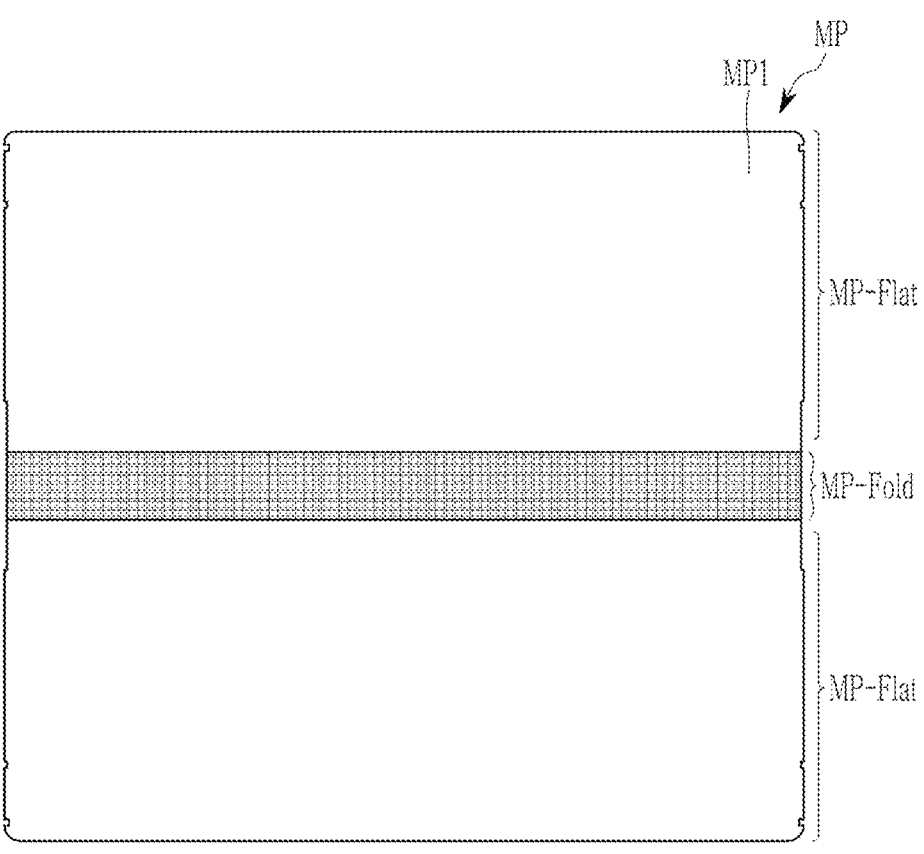
FIG. 4 illustrates a top plan view of a rear surface of a metal plate according to an embodiment.

FIG. 4 illustrates a top plan view of a rear surface of a metal plate according to an embodiment.

In an embodiment, the metal plate MP is attached to a rear surface of an emissive display device. In such an embodiment, when the flexible emissive display device is folded, so that the flexible emissive display device can remain in a folded state, and the metal plate MP additionally serves to enhance impact resistance.

FIG. 4 illustrates a rear surface of the metal plate MP, i.e., a rear surface of the lower metal plate MP1.

In the lower metal plate MP1, a mesh pattern portion MP-Fold is defined or formed in a portion corresponding to the folding area FA. The mesh pattern portion MP-Fold has a mesh structure with a plurality of openings, and serves to reduce tensile stress or compressive stress generated by folding of the metal plate MP. Herein, the openings defined or formed in the mesh pattern portion MP-Fold may have various planar shapes, such as polygons such as circles and rectangles.

Flat portions MP-Flat corresponding to a flat area are positioned at opposite sides of the mesh pattern portion MP-Fold in the lower metal plate MP1. The flat portions MP-Flat of the lower metal plate MP1 are formed entirely flat, and a protrusion or an opening may be selectively defined or formed according to an alternative embodiment. The opening positioned in the flat portion MP-Flat may be an opening for recognizing an alignment mark.

Hereinafter, a buffer structure of the metal plate MP according to an embodiment will be described through an enlarged rear view with reference to FIG. 5.

Figure 5:
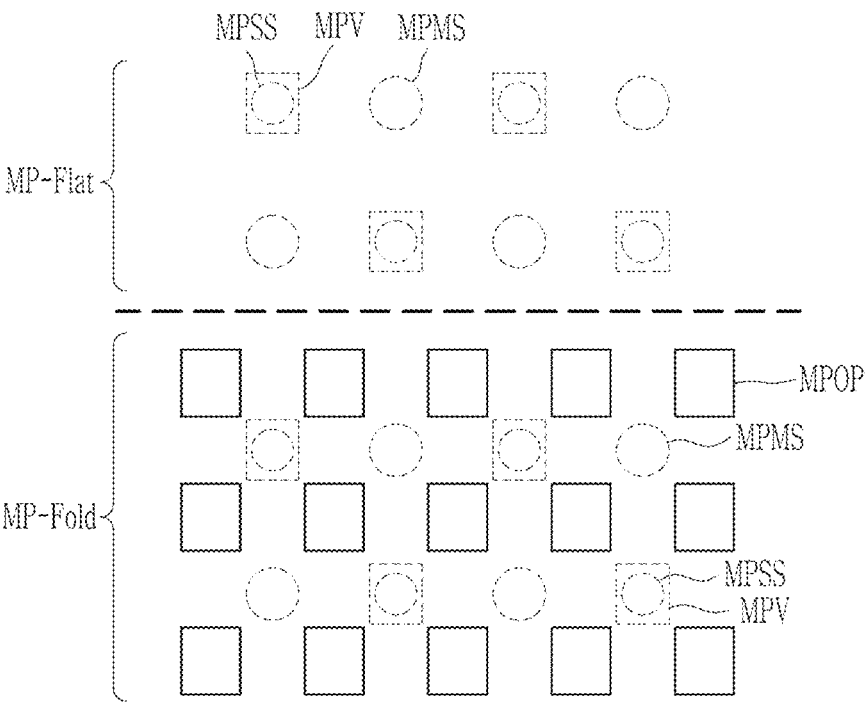
FIG. 5 illustrates an enlarged view of a partial rear surface of a metal plate according to an embodiment.

FIG. 5 illustrates an enlarged view of a partial rear surface of a metal plate according to an embodiment.

FIG. 5 illustrates opposite sides of the lower metal plate MP1 of the metal plate MP based on a boundary between the mesh pattern portion MP-Fold and the flat portion MP-Flat. In addition, in FIG. 5, the spacers MPMS and MPSS, which are invisible portions covered by the lower metal plate MP1, and the step portion MPV of the upper metal plate MP2, are illustrated by a dotted line.

As illustrated in FIG. 5, the main spacer MPMS, the subspacer MPSS, and the step portion MPV are disposed or formed in the flat portion MP-Flat of the lower metal plate MP1.

The main spacer MPMS and the subspacer MPSS are alternately positioned, and each of the main spacer MPMS and the subspacer MPSS may be formed in a same number. However, according to an embodiment, one of the main spacer MPMS and the subspacer MPSS may be formed in a larger number than the other thereof.

In an embodiment, as shown in FIG. 5, a cross-sectional size of the main spacer MPMS may be larger than that of the subspacer MPSS, but not being limited thereto. According to an alternative embodiment, the subspacer MPSS may have a larger cross-sectional size or may have a same cross-sectional size. In an embodiment, cross-sectional shapes of the main spacer MPMS and the subspacer MPSS may be circular as shown in FIG. 5, but not being limited thereto. Alternatively, the main spacer MPMS and the subspacer MPSS may have various cross-sectional shapes including polygons, such as a quadrangle, for example.

In an embodiment, the step portion MPV is defined or formed at a portion corresponding to the subspacer MPSS in the upper metal plate MP2. The step portion MPV overlaps the subspacer MPSS in a plan view, and the step portion MPV may have a larger area than that of the subspacer MPSS, so that the subspacer MPSS may be positioned in the step portion MPV in a plan view. In an embodiment, as shown in FIG. 5, a planar shape of the step portion MPV may have a rectangular shape, which is different from a planar shape of the subspacer MPSS, but not being limited thereto. According to an alternative embodiment, the step portion MPV may have a same planar shape as that of the subspacer MPSS. The planar shape of the step portion MPV may also have various shapes, such as a circle or a polygon.

In an embodiment, a plurality of openings MPOP are additionally defined in the mesh pattern portion MP-Fold of the lower metal plate MP1 so that the folding area FA can be easily folded.

In an embodiment, the main spacer MPMS and the subspacer MPSS are not formed in a portion where the plurality of openings MPOP are positioned in the mesh pattern portion MP-Fold of the lower metal plate MP1, and the main spacer MPMS and the subspacer MPSS are formed while overlapping a portion where the openings MPOP are not positioned. According to an alternative embodiment, the main spacer MPMS and/or the subspacer MPSS may overlap the openings MPOP. In such an embodiment, a size of the main spacer MPMS and/or the subspacer MPSS is larger than a size of the openings MPOP, and thus the main spacer MPMS and/or the subspacer MPSS may be formed to be supported by the lower metal plate MP1. In an embodiment, the step portion MPV is formed at a portion corresponding to the subspacer MPSS in the upper metal plate MP2. The step portion MPV overlaps the subspacer MPSS in a plan view, and the step portion MPV may have a larger area than that of the subspacer MPSS, so that the subspacer MPSS may be positioned in the step portion MPV in a plan view.

Hereinafter, a method of manufacturing the metal plate MP according to the embodiment of FIG. 3 will be described with reference to FIG. 6.

Figure 6:
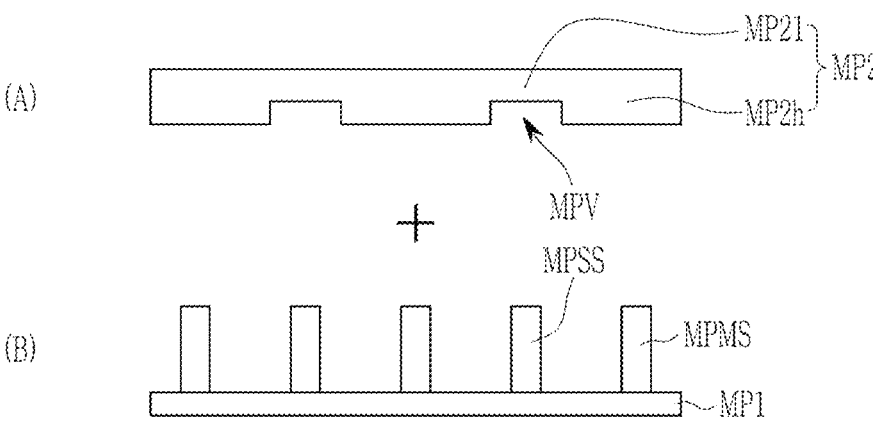
FIG. 6 illustrates a manufacturing method of a metal plate according to an embodiment.
Figure 6:
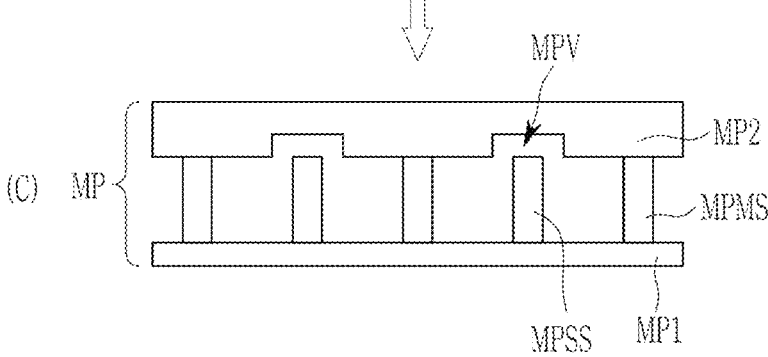

FIG. 6 illustrates a manufacturing method of a metal plate according to an embodiment.

Referring to (A) of FIG. 6, an upper metal plate MP2 having the step portion MPV is prepared by etching a portion of a metal plate having a plate-like structure. Herein, the step portion MPV may be formed through dry or wet etching after forming a photoresist pattern on one surface of the metal plate. According to an embodiment, a dry film capable of forming a pattern by irradiating ultraviolet (UV) light (e.g., UV type of dry film) may be used. That is, the dry film is attached on the metal plate, irradiated with ultraviolet rays, and then developed to position a pattern on the metal plate, and the metal plate is etched based on the pattern to complete the upper metal plate MP2 having the step portion MPV. Herein, the upper metal plate MP2 may be divided into a portion MP2*l* (hereinafter referred to as a first portion) having a thin thickness due to the position of the step portion MPV and a portion MP2*h* (hereinafter also referred to as a second portion) having a thick thickness because the step portion MPV does not exist.

Meanwhile, referring to (B) of FIG. 6, the main spacer MPMS and the subspacer MPSS are formed by using an organic material on one surface of the lower metal plate MP1 having a plate-like structure. The main spacer MPMS and the subspacer MPSS may include or be formed of a same organic material as each other. Herein, the organic material may have photosensitivity, and the main spacer MPMS and the subspacer MPSS may be formed by exposing and developing an organic material. In an embodiment, where the organic material is not photosensitive, the organic material is stacked, and then a photoresist pattern is formed thereon, and then the organic material is etched based on the formed photoresist pattern to form the main spacer MPMS and the subspacer MPSS.

In an embodiment, processes shown in (A) and (B) of FIG. 6 may be sequentially performed, or may be simultaneously performed.

Through the processes of (A) and (B) of FIG. 6, the upper metal plate MP2 having the step portion MPV and the lower metal plate MP1 having the main spacer MPMS and the subspacer MPSS on one surface are completed, and then as illustrated in (C) of FIG. 6, the metal plate MP is completed by bonding the upper metal plate MP2 having the step portion MPV and the lower metal plate MP1 having the main spacer MPMS and the subspacer MPSS together. Herein, a thin portion MP2*l* due to the position of the step portion MPV in the upper metal plate MP2 may be bonded to correspond to (or to overlap) the subspacer MPSS, and a thick portion Mp2*h* due to no existence of the step portion MPV in the upper metal plate MP2 may be bonded to correspond to the main spacer MPMS.

The metal plate MP manufactured through processes described above with reference to FIG. 6 has a buffer structure in which a space is formed between the subspacer MPSS and the upper metal plate MP2 by the step portion MPV of the upper metal plate MP2, such that the impact resistance is strengthened. In an embodiment, air may be positioned between the lower metal plate MP1 and the upper metal plate MP2 and around the spacers MPMS and MPSS. However, according to an alternative embodiment, a buffer effect may be strengthened by filling a filler that can serve as a buffer.

Hereinafter, a structure of the metal plate MP according to alternative embodiments will be described with reference to FIG. 7 to FIG. 12.

First, the structure of an alternative embodiment of FIG. 7 will be described.

Figure 7:
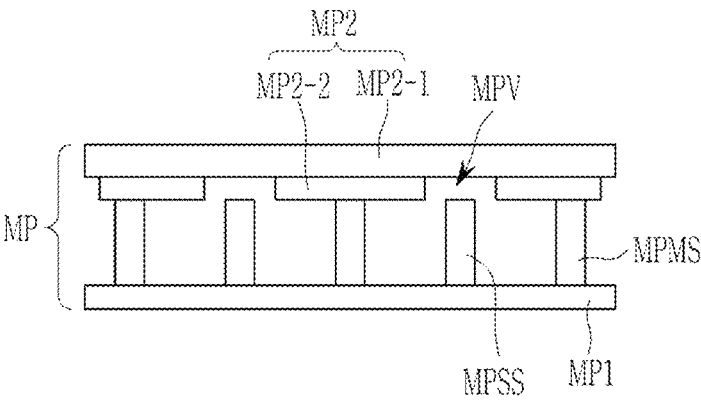
FIG. 7 illustrates a cross-sectional view of a metal plate according to another embodiment.

FIG. 7 illustrates a cross-sectional view of a metal plate according to an alternative embodiment.

FIG. 7 illustrates an upper metal plate MP2 having a structure that is different from that of FIG. 3 and FIG. 6.

In the upper metal plate MP2 according to an embodiment of FIG. 7, an insulating layer MP2-2 including an organic material or an inorganic material is disposed or formed on one surface of the metal plate MP2-1 having a plate-like structure. As a result, a portion where the insulating layer MP2-2 is not formed, i.e., a space between adjacent insulating layers MP2-2, corresponds to the step portion MPV.

In a method of forming the upper metal plate MP2 as illustrated in FIG. 7, an insulating material may be stacked on one surface of the metal plate MP2-1, and then the insulating layer MP2-2 may be completed by forming a photoresist pattern and dry or wet etching the insulating material using the photoresist pattern.

In an embodiment of FIG. 7, the main spacer MPMS and the insulating layer MP2-2 are in contact with each other, and since the insulating layer MP2-2 may have a higher buffering effect than that of the metal plate, impact resistance may be improved.

Hereinafter, a structure of another alternative embodiment will be described with reference to FIG. 8 and FIG. 9.

Figure 8:
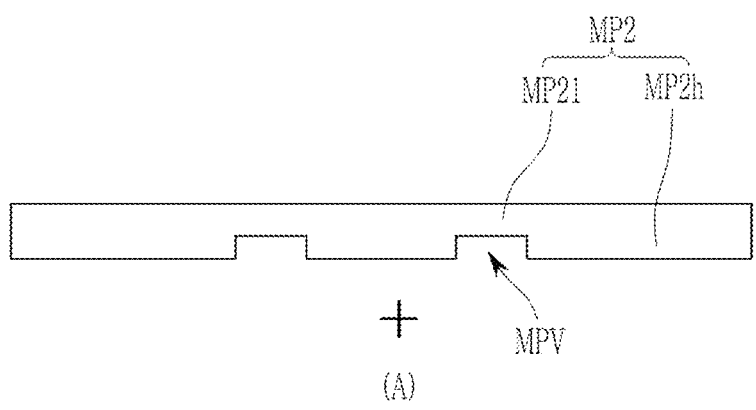
FIG. 8 illustrates a manufacturing method of a metal plate according to an alternative embodiment.
Figure 8:
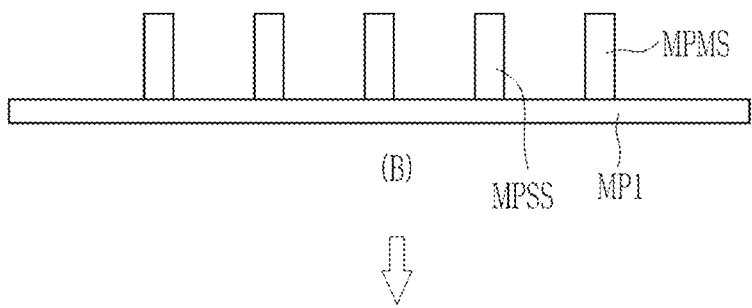
Figure 8:
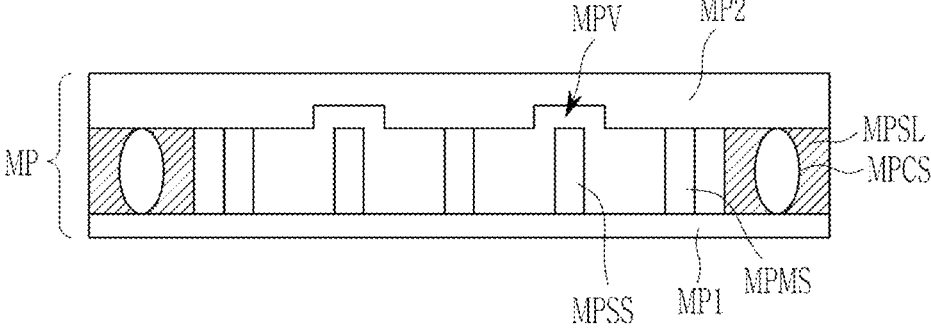
Figure 9:
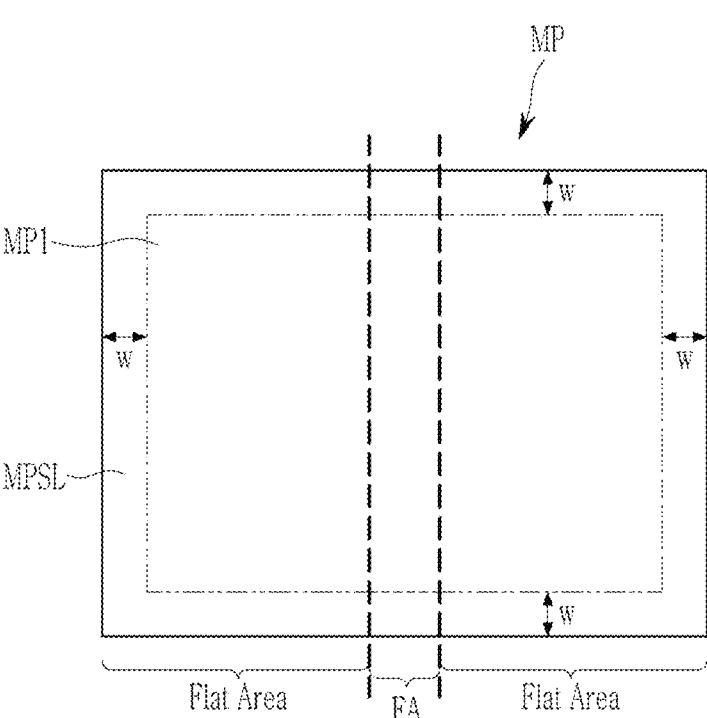
FIG. 9 illustrates a rear view of the flexible display device according to the embodiment of FIG. 8.

FIG. 8 illustrates a manufacturing method of a metal plate according to an alternative embodiment, and FIG. 9 illustrates a rear view of the flexible display device according to the embodiment of FIG. 8.

The metal plate MP according to an embodiment of FIG. 8 and FIG. 9 further includes a sealant MPSL formed along an outer edge of the metal plate MP. In such an embodiment, it is possible to close and seal a space between the upper metal plate MP2 and the lower metal plate MP1 to have a waterproof effect or a dustproof effect by the sealant MPSL. In addition, a filler other than air may be injected into the space between the upper metal plate MP2 and the lower metal plate MP1 and sealed, thereby further improving impact resistance.

Meanwhile, according to an embodiment of FIG. 8, a plurality of conductive spacers MPCS are additionally included inside the sealant MPSL. The conductive spacers MPCS may be in contact with the upper metal plate MP2 and the lower metal plate MP1 to improve thermal conductivity between the upper metal plate MP2 and the lower metal plate MP1 or to improve a grounding characteristic.

Hereinafter, the manufacturing method of the metal plate MP described above will be described with reference to FIG. 8.

Referring to (A) of FIG. 8, an upper metal plate MP2 having the step portion MPV is completed by etching a portion of a metal plate having a plate-like structure. In an embodiment, the upper metal plate MP2 having the step portion MPV shown in (A) of FIG. 8 may be formed in various ways as described above with reference to (A) of FIG. 6, and the upper metal plate MP2 may be divided into the thin portion MP2*l* in which the step portion MPV is positioned and the thick portion MP2*h* in which the step portion MPV does not exist.

Meanwhile, referring to (B) of FIG. 8, the main spacer MPMS and the subspacer MPSS are formed by using an organic material on one surface of the lower metal plate MP1 having a plate-like structure. The main spacer MPMS and the subspacer MPSS may be formed of a same organic material as each other. Also, in such an embodiment, the lower metal plate MP1 including the main spacer MPMS and the subspacer MPSS on a surface thereof may be formed in various ways, as described with reference to (B) of FIG. 6.

In an embodiment, processes shown in (A) and (B) of FIG. 8 may be sequentially performed, or may be simultaneously performed.

Through the processes shown in (A) and (B) of FIG. 8, the upper metal plate MP2 having the step portion MPV and the lower metal plate MP1 having the main spacer MPMS and the subspacer MPSS on one surface are completed, and then the upper metal plate MP2 having the step portion MPV and the lower metal plate MP1 having the main spacer MPMS and the subspacer MPSS are bonded to each other as illustrated in (C) of FIG. 8. In this case, the sealant MPSL may be positioned along the outer sides of the upper metal plate MP2 and the lower metal plate MP1, and referring to FIG. 9, the sealant MPSL may be formed along the outer sides of the upper metal plate MP2 and the lower metal plate MP1 to form an outer boundary of the metal plate MP. In such an embodiment, a space between the lower metal plate MP1 and the upper metal plate MP2 and a periphery of the spacers MPMS and MPSS is blocked and sealed from the outside by the sealant MPSL. According to an embodiment, air may be sealed. In an alternative embodiment, before sealing is performed with the sealant MPSL, a filler that can serve as a buffer may be filled in the spacers MPMS and MPSS so that the filler is sealed. In such an embodiment, since the filler has a higher cushioning effect than air, impact resistance may be further improved.

In such an embodiment, a thin portion MP2*l* due to the position of the step portion MPV in the upper metal plate MP2 may be bonded to correspond to the subspacer MPSS, and a thick portion Mp2*h* due to no existence of the step portion MPV in the upper metal plate MP2 may be bonded to correspond to the main spacer MPMS.

The metal plate MP manufactured through processes described above with reference to FIG. 8 has a buffer structure in which a space is formed between the subspacer MPSS and the upper metal plate MP2 by the step portion MPV of the upper metal plate MP2, so the impact resistance is strengthened. In such an embodiment, the space between the upper metal plate MP2 and the lower metal plate MP1 can be sealed by the sealant MPSL, and thus the metal plate MP can have a waterproof or dustproof effect, or the impact resistance of the metal plate MP may be further improved by positioning a separate filler instead of air. In such an embodiment, thermal conductivity or a grounding characteristic between the upper metal plate MP2 and the lower metal plate MP1 may be improved by the conductive spacer MPCS.

FIG. 9 illustrates a rear structure of the metal plate MP completed through (C) of FIG. 8.

FIG. 9 illustrates only the lower metal plate MP1 and the sealant MPSL positioned on the rear surface of the metal plate MP.

Referring to FIG. 9, the sealant MPSL is formed along outer edges of the metal plate MP and/or the lower metal plate MP1, and is also positioned in the folding area FA to seal an inside thereof. FIG. 9 illustrates a width w of the sealant MPSL, and the sealant MPSL may be formed to have a width that is less than or equal to 2 millimeters (mm) for sealing.

Figure 11:
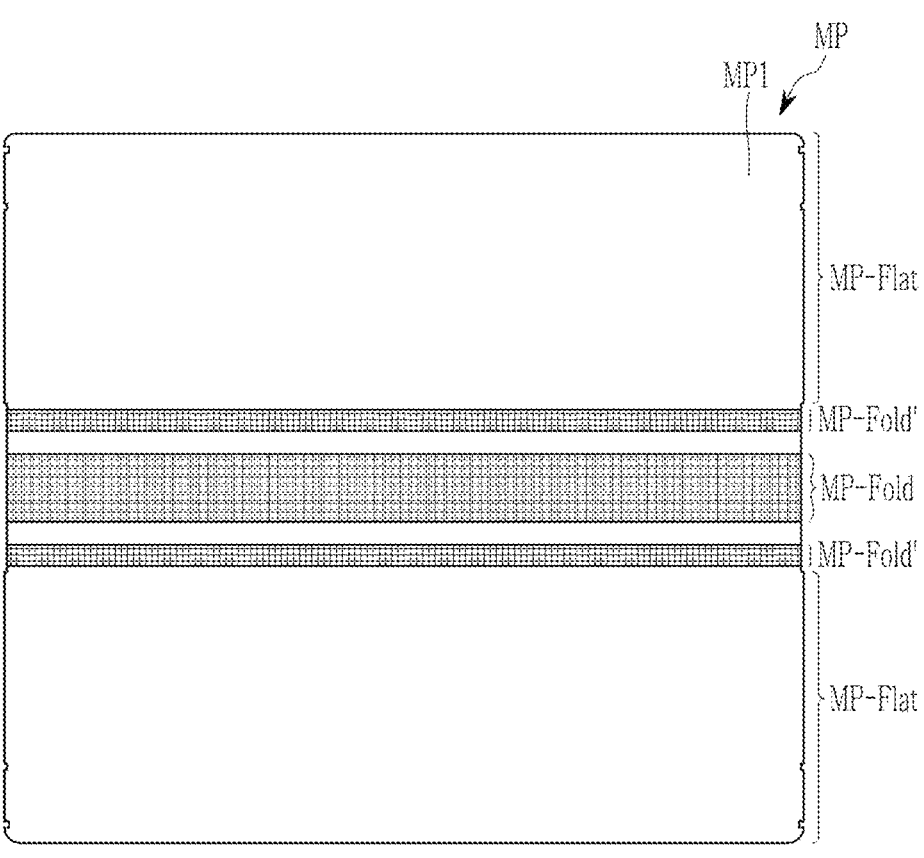
FIG. 11 illustrates a top plan view of a rear surface of a metal plate according to an alternative embodiment.

Although not illustrated in FIG. 9, at least one mesh pattern portion may be defined or provided in the folding area FA as illustrated in FIG. 4, FIG. 5, and FIG. 11, and a plurality of openings may be positioned in the mesh pattern portion. In addition, the main spacer and the subspacer are positioned, and the step portion MPV is also formed, and thus as illustrated in FIG. 5, the openings MPOP, the main spacer MPMS, the subspacer MPSS, and the step portion MPV may be positioned in the mesh pattern portion.

Hereinafter, a structure of another alternative embodiment will be described with reference to FIG. 10.

Figure 10:
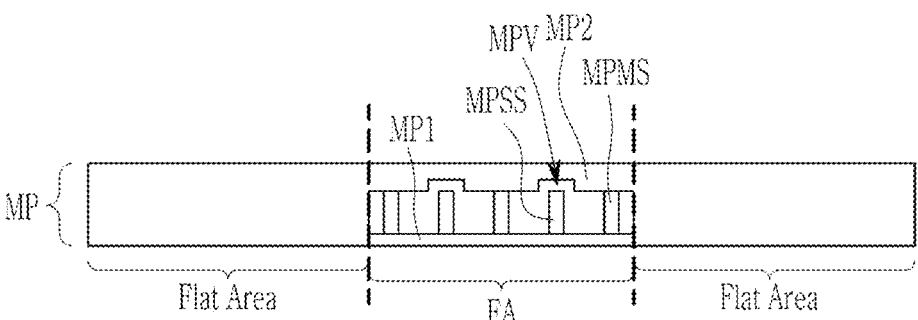
FIG. 10 illustrates a cross-sectional view of a metal plate according to an alternative embodiment.

FIG. 10 illustrates a cross-sectional view of a metal plate according to an alternative embodiment.

An embodiment in which the metal plate MP has a buffer structure only in the folding area FA and is formed only of a metal material in the other areas (flat area) is illustrated in FIG. 10. In such an embodiment, the lower metal plate MP1, the upper metal plate MP2 having the stepped portion MPV, the main spacer MPMS, and the subspacer MPSS are formed in the folding area FA of the metal plate MP as shown in FIG. 10. Although FIG. 10 shows an embodiment where a metal material is integrally formed in the flat area, but not being limited thereto. Alternatively, the metal plate MP may have a structure in which two upper and lower metal materials are attached to each other. In such an embodiment, the two metal materials may be portions extending from the lower metal plate MP1 and the upper metal plate MP2, respectively.

The metal plate MP according to the embodiment of FIG. 10 may also have sealed spaces around the spacers MPMS and MPSS, and thus air or a filler may be positioned between the lower metal plate MP1 and the upper metal plate MP2 and around the spacers MPMS and MPSS.

In an alternative embodiment, a buffer structure may be formed only in the flat area, and the buffer structure may not be formed in the folding area FA. The metal plate MP may be variously modified in another structure.

Figure 12:
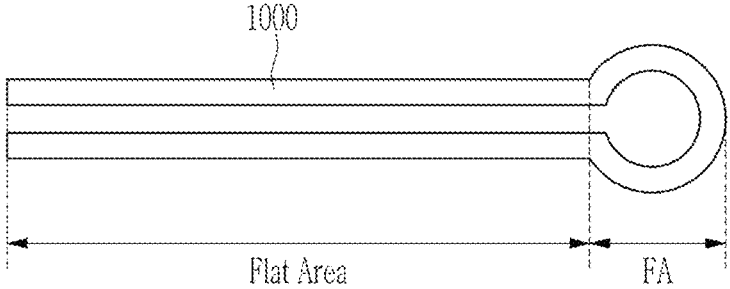
FIG. 12 illustrates a folded cross-section of the flexible display device using the metal plate of FIG. 11.

Hereinafter, a structure of another alternative embodiment of the metal plate will be described with reference to FIG. 11 and FIG. 12, and FIG. 11 illustrates a modified example of the embodiment of FIG. 4.

FIG. 11 illustrates a top plan view of a rear surface of a metal plate according to an alternative embodiment, and FIG. 12 illustrates a folded cross-section of the flexible display device using the metal plate of FIG. 11.

In an embodiment, as shown in FIG. 11, the metal plate MP includes three mesh pattern portions MP-Fold and MP-Fold'.

The mesh pattern portions MP-Fold and MP-Fold' have a mesh structure with a plurality of openings, and in the embodiment of FIG. 11, mesh pattern portions MP-Fold and MP-Fold' includes one main mesh pattern portion MP-Fold and two submesh pattern portions MP-Fold' at opposite sides thereof. The mesh pattern portions MP-Fold and MP-Fold' may reduce tensile stress or compressive stress generated by folding of the metal plate MP.

In the metal plate MP according to the embodiment of FIG. 11, flat portions MP-Flat are positioned on opposite sides of the two submesh pattern portions MP-Fold', and the flat portions MP-Flat may also be positioned between the main mesh pattern portion MP-Fold and the submesh pattern portions MP-Fold'. According to an embodiment, the flat portions MP-Flat between the main mesh pattern portion MP-Fold and the submesh pattern portions MP-Fold' may also be bent, and when folded over the main mesh pattern portion MP-Fold and the submesh pattern portions MP-Fold', it may be a portion folded with a greater radius.

The main mesh pattern portion MP-Fold and the submesh pattern portion MP-Fold' may have openings of different sizes, such that a size of the mesh structure may be different from each other, and the main mesh pattern portion MP-Fold' may be formed to have a larger width than that of the sub-mesh pattern portion MP-Fold'.

In an embodiment, as shown in FIGS. 11 and 12, a flexible display device including a metal plate MP including one main mesh pattern part MP-Fold and two submesh pattern portions MP-Fold' may have a dumbbell-like cross-sectional shape when folded.

FIG. 12 schematically illustrates a flexible display device 1000 including a metal plate MP including one main mesh pattern portion MP-Fold and two submesh pattern portions MP-Fold'. Referring to FIG. 12, the flexible display device 1000 may be folded to have a first diameter by the main mesh pattern part MP-Fold, and after a flat or slightly bent portion is positioned due to a non-folded flat portion MP-Flat positioned between the main mesh pattern portion MP-Fold and the submesh pattern portions MP-Fold', the flexible display device 1000 is further folded by the submesh pattern portion MP-Fold' so that an overall folding structure may have a dumbbell-like shape.

However, according to another alternative embodiment, as illustrated in FIG. 4, the flexible display device 1000 may include only one mesh pattern portion, and an additional mesh pattern portion may be further included in another portion. In such an embodiment, the additionally formed mesh pattern portion may also include one main mesh pattern portion MP-Fold and two sub-mesh pattern portions MP-Fold', or may include only one mesh pattern portion. A plurality of positions of the emissive display device may be folded into a dumbbell shape by the additionally formed mesh pattern portion. There may be two or more portions that are folded to have the dumbbell shape, and according to the embodiment, the flexible display device 1000 may be folded to have the dumbbell shape in three positions.

Characteristics of the flexible display device including the metal plate MP having the buffer structure as described above will be described with reference to FIG. 13 to FIG. 15.

Figure 13:
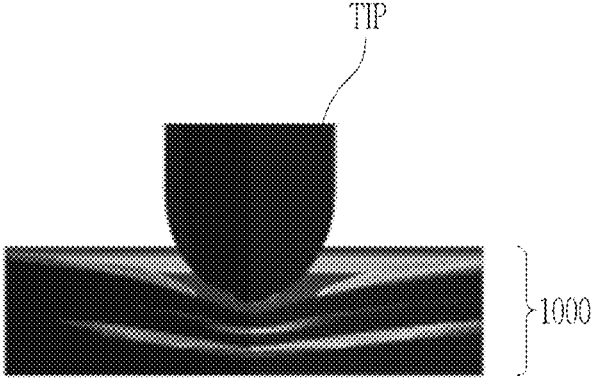
FIG. 13 illustrates a method for testing impact resistance.

FIG. 13 illustrates a method for testing impact resistance.

In FIG. 13, when a test is performed to test whether a bad pixel is generated by dropping a tip TIP to test impact resistance, a magnitude of an impact that may occur in the flexible display device 1000 is illustrated in different gray-scales.

In spite of the test of dropping the tip TIP as illustrated in FIG. 13, in the flexible display device 1000 according to an embodiment, the metal plate MP may have a cushioning structure to alleviate shock, and impact resistance may be increased.

As such, since the metal plate MP supplements the impact resistance of the flexible display device 1000, in other portions except for the metal plate MP, an additional protective film to reinforce the impact resistance may be omitted, and without using materials with high impact resistance.

Hereinafter, a flexible display device with an improved deformation characteristic will be described with reference to FIG. 14 and FIG. 15.

Figure 14:
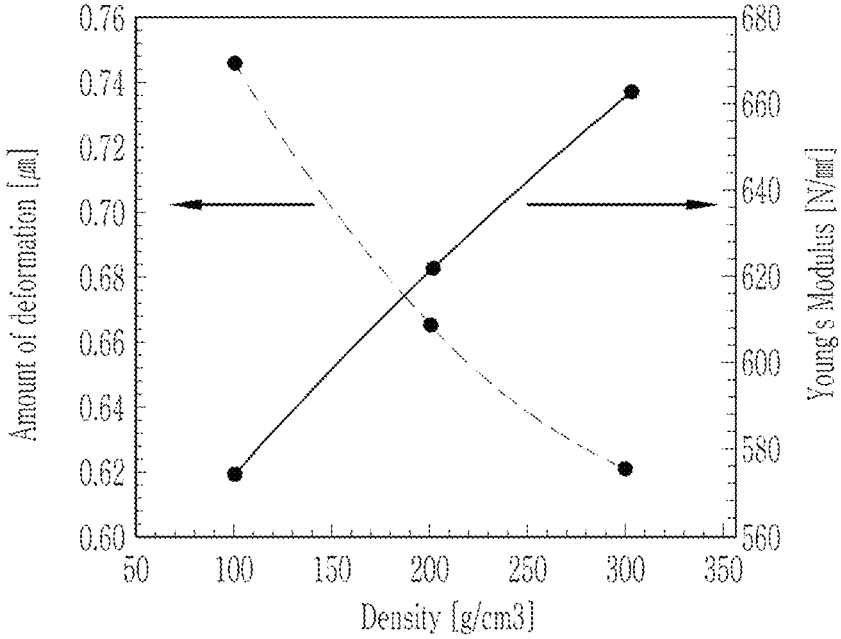
FIG. 14 and FIG. 15 illustrate characteristics of a flexible display device according to a comparative embodiment.

FIG. 14 and FIG. 15 illustrate characteristics of a flexible display device according to a comparative embodiment.

Since the flexible display device 1000 according to an embodiment supplements the impact resistance by including the metal plate MP as described above, a portion of the flexible display device 1000 excluding the metal plate MP may to allowed to increase a strain rate by adopting a material or a physical property without considering the impact resistance.

First, a change in an amount of deformation (indicated by a dotted line) and a Young's Modulus value (indicated by a solid line) depending on a characteristic (density) of a material will be described with reference to FIG. 14.

Referring to FIG. 14, when the density of the material is increased, the amount of deformation is reduced, so that deformation of the material is less likely to occur. On the other hand, the modulus value is increased to have a flexible characteristic. In the meantime, as the density of the material increases, the impact resistance tends to increase, so there is a trade-off relationship between the amount of deformation and the impact resistance based on the density of the material. Accordingly, it is not possible to achieve high impact resistance while increasing a deformation amount. Thus, an additional protective film may be formed on an entire surface thereof to reinforce impact resistance. However, in an embodiment of the invention, since the metal plate MP has a buffer structure, a protective film or a shock absorbing layer may not be added on a cover window WIN or a process for protecting pixels in a display panel to improve impact resistance may not be performed, and a material having a high deformation amount may be used for portions other than the metal plate MP.

When the material having the high deformation amount is used in the flexible display device 1000, a same effect as that in FIG. 15 may occur.

FIG. 15 illustrates a flexible display device of a comparative embodiment, and a display panel DP and two separate supporting substrates SUP1 and SUP2 are illustrated outside the display panel DP. As the support substrates SUP1 and SUP2 are folded ((A) of FIG. 15) or unfolded ((B) of FIG. 15), the display panel DP is also folded or unfolded. In this case, the display panel DP of the comparative embodiment secures its own impact resistance by including a material with a low amount of deformation. The display panel DP of the comparative embodiment may pass an impact resistance test by securing impact resistance, but since the amount of deformation is small, when folding and unfolding is repeated, the degree of deformation is small, which may cause bending deformation PE in the folding area FA.

In an embodiment of the flexible display device 1000 described herein, since the metal plate MP ensures the impact resistance, a material included in the display panel DP may secure the amount of deformation, and thus the bending deformation PE as illustrated in FIG. 15 may not occur or be reduced.

The invention should not be construed as being limited to the embodiments set forth herein. Rather, these embodiments are provided so that this disclosure will be thorough and complete and will fully convey the concept of the invention to those skilled in the art.

While the invention has been particularly shown and described with reference to embodiments thereof, it will be understood by those of ordinary skill in the art that various changes in form and details may be made therein without departing from the spirit or scope of the invention as defined by the following claims.

What is claimed is:

1. A flexible display device comprising:
a display panel including pixels, wherein a folding area is defined in the display panel; and
a metal plate disposed on a rear surface of the display panel,
wherein the metal plate includes:
a lower metal plate;
an upper metal plate including a step portion; and
a main spacer and a subspacer, which are disposed between the lower metal plate and the upper metal plate,
wherein the subspacer overlaps the step portion in a plan view,
the metal plate has a folding area in a portion corresponding to the folding area of the display panel,
a mesh pattern portion with a plurality of openings is defined in the folding area of the metal plate,
the main spacer and the subspacer and the step portion are provided in plural numbers,
the plural numbers of the main spacer are arranged alternately with the plural numbers of the subspacer and the plural numbers of the step portion in first rows and first columns, and
the openings of the mesh pattern portion are arranged in second rows and second columns in interstitial regions between the first rows and the first columns such that the plural numbers of the main spacer and the subspacer and the step portion are positioned not to overlap the openings of the mesh pattern portion in the plan view.

2. The flexible display device of claim 1, wherein
the upper metal plate includes a first portion corresponding to the step portion and a second portion having a greater thickness than a thickness of the first portion, and
the main spacer overlaps the second portion in the plan view.

3. The flexible display device of claim 2, wherein
air is between the lower metal plate and the upper metal plate and around the main spacer and the subspacer.

4. The flexible display device of claim 2, wherein
the metal plate further includes a sealant disposed along a periphery thereof, and
the sealant seals a space between the upper metal plate and the lower metal plate.

5. The flexible display device of claim 4, wherein
the sealant further includes a plurality of conductive spacers, and
the conductive spacers are in contact with the upper metal plate and the lower metal plate.

6. The flexible display device of claim 4, wherein
a filler is disposed in a space sealed by the sealant, wherein the filler functions as a buffer.

7. The flexible display device of claim 2, wherein
the main spacer, the subspacer, and the step portion are
positioned over an entire area of the metal plate.

8. The flexible display device of claim 2, wherein
the metal plate has a folding area in a portion corresponding to the folding area of the display panel, and
the main spacer, the subspacer, and the step portion are
positioned in the folding area of the metal plate.

9. The flexible display device of claim 2, wherein
the upper metal plate includes a metal plate having a
plate-like structure and a plurality of insulating layers
disposed on the metal plate, and
the step portion is positioned between adjacent insulating
layers among the insulating layers on the metal plate in
the plan view.

10. The flexible display device of claim 2, further comprising:
a cover window disposed on a front surface of the display
panel; and
a protective layer or a cushion layer disposed between the
display panel and the metal plate.

11. A metal plate comprising:
a lower metal plate;
an upper metal plate including a step portion; and
a main spacer and a subspacer, which are disposed
between the upper metal plate and the lower metal
plate,
wherein the subspacer overlaps the step portion in a plan
view,
the upper metal plate includes a first portion corresponding to the step portion and a second portion having a
greater thickness than a thickness of the first portion,
and
the main spacer overlaps the second portion in the plan
view,
a mesh pattern portion with a plurality of openings is
defined in a folding area of the metal plate, the main spacer and the subspacer and the step portion are
provided in plural numbers,
the plural numbers of the main spacer are arranged
alternately with the plural numbers of the subspacer
and the plural numbers of the step portion in first rows
and first columns, and
the openings of the mesh pattern portion are arranged in
second rows and second columns in interstitial regions
between the first rows and the first columns such that
the plural numbers of the main spacer and the subspacer and the step portion are positioned not to overlap
the openings of the mesh pattern portion in the plan
view.

12. The metal plate of claim 11, wherein
air is between the lower metal plate and the upper metal
plate and around the main spacer and the subspacer.

13. The metal plate of claim 11, wherein
the metal plate further includes a sealant disposed along
a periphery thereof, and
the sealant seals a space between the upper metal plate
and the lower metal plate.

14. The metal plate of claim 13, wherein
the sealant further includes a plurality of conductive
spacers, and
the conductive spacers are in contact with the upper metal
plate and the lower metal plate.

15. The metal plate of claim 13, wherein
a filler is disposed in a space sealed by the sealant,
wherein the filler functions as a buffer.

16. The metal plate of claim 11, wherein
the upper metal plate includes a metal plate having a
plate-like structure and a plurality of insulating layers
disposed on the metal plate, and
the step portion is positioned between adjacent insulating
layers among the insulating layers on the metal plate in
the plan view.

* * * * *